United States Patent [19]

Heid et al.

[11] Patent Number: 5,432,448
[45] Date of Patent: Jul. 11, 1995

[54] PULSE SEQUENCE FOR A NUCLEAR MAGNETIC RESONANCE APPARATUS

[75] Inventors: Oliver Heid, Erlangen; Michael Deimling, Moehrendorf-Kleinseebach, both of Germany

[73] Assignee: Siemens Aktiengesellschaft, Munich, Germany

[21] Appl. No.: 308,970

[22] Filed: Sep. 20, 1994

Related U.S. Application Data

[63] Continuation of Ser. No. 28,808, Mar. 10, 1993, abandoned.

[30] Foreign Application Priority Data

Mar. 12, 1992 [DE] Germany .......................... 42 07 930.6
Aug. 10, 1992 [DE] Germany .......................... 42 26 446.4

[51] Int. Cl.⁶ .......................................... G01R 33/44
[52] U.S. Cl. .......................................... 324/309
[58] Field of Search ............... 324/307, 309, 300, 318; 128/653.2

[56] References Cited

U.S. PATENT DOCUMENTS

| | | | |
|---|---|---|---|
| 4,818,940 | 4/1989 | Hennig et al. | 324/309 |
| 4,847,560 | 7/1989 | Sattin | 324/309 |
| 4,862,082 | 8/1989 | Hennig | 324/309 |
| 4,891,595 | 1/1990 | Granot | 324/309 |
| 5,126,673 | 6/1992 | Hennig | 324/309 |
| 5,162,730 | 11/1992 | Schmitt et al. | 324/309 |

FOREIGN PATENT DOCUMENTS 0076054 4/1983 European Pat. Off. .

OTHER PUBLICATIONS

"Echoes—How to Generate, Recognize, Use or Avoid Them in MR-Imaging Sequences," Hennig, Concepts in Magnetic Resonance, vol. 3, 1991 (pp. 125–143).
"Clinical Applications and Methodological Developments of the Rare Technique," Hennig et al., Magnetic Resonance Imaging, vol. 6, pp. 391–395 (1988).
"Multiecho Imaging Sequences with Low Refocusing Flip Angles," Hennig, J. Mag. Res. vol. 78, pp. 397–407 (1988).

Primary Examiner—Candra L. O'Shea
Assistant Examiner—Raymond Y. Mah
Attorney, Agent, or Firm—Hill, Steadman & Simpson

[57] ABSTRACT

A sequence of chronologically non-equidistant radio frequency excitation pulses and a first gradient are activated during an excitation phase. The existing spin magnetization is divided into sub-groups by each excitation pulse that follows the first excitation pulse. A chronologically graduated focusing of the individual sub-groups ensues during the read-out phase under a further gradient. A number of nuclear magnetic resonance signals can thereby be acquired following a single excitation phase, so that a short image pick-up time becomes possible, without the necessity of a fast switching of the gradients. Further, pure spin echoes can be acquired, which are insensitive to local field inhomogeneities in comparison to gradient echoes.

30 Claims, 12 Drawing Sheets

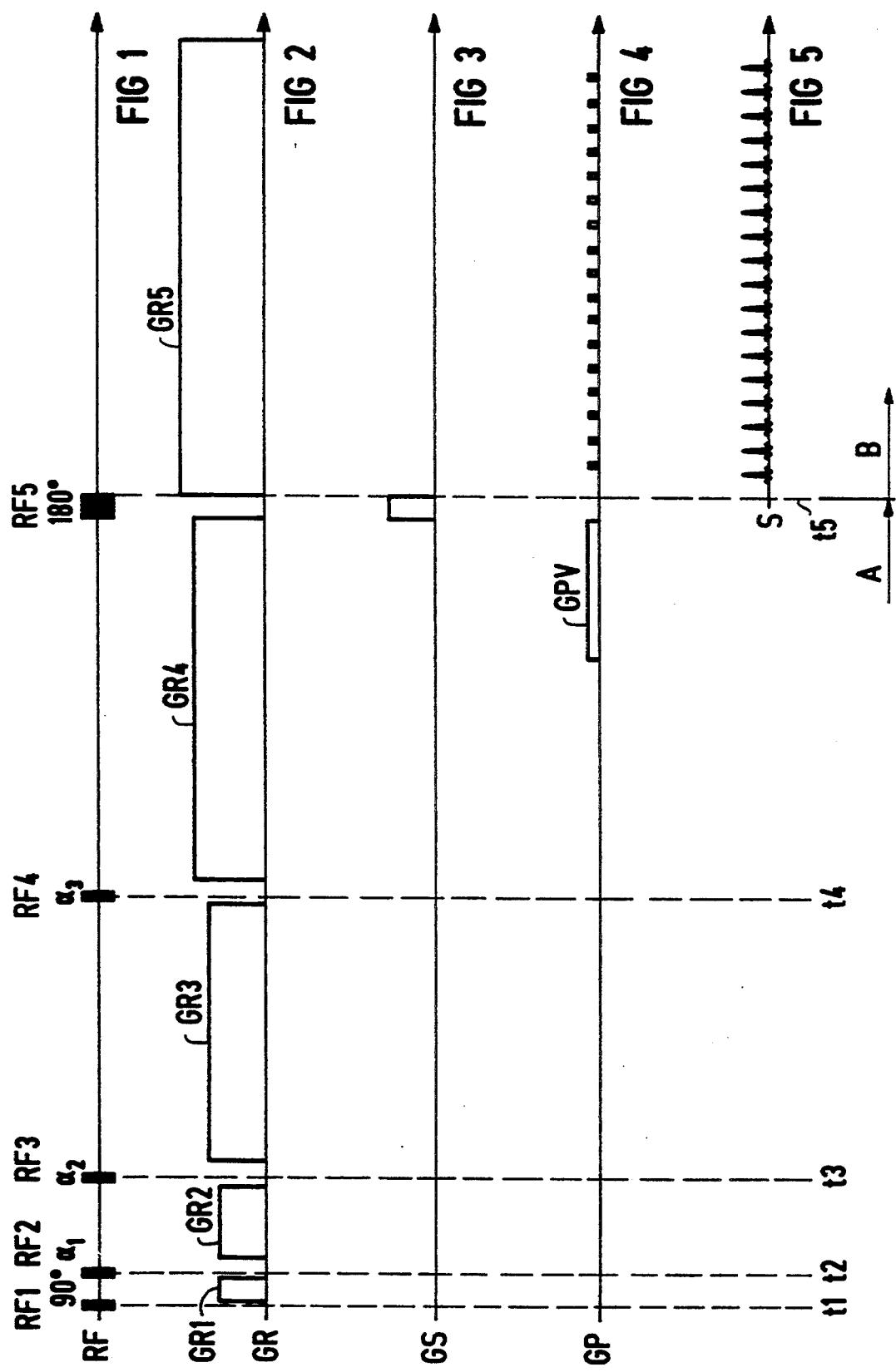

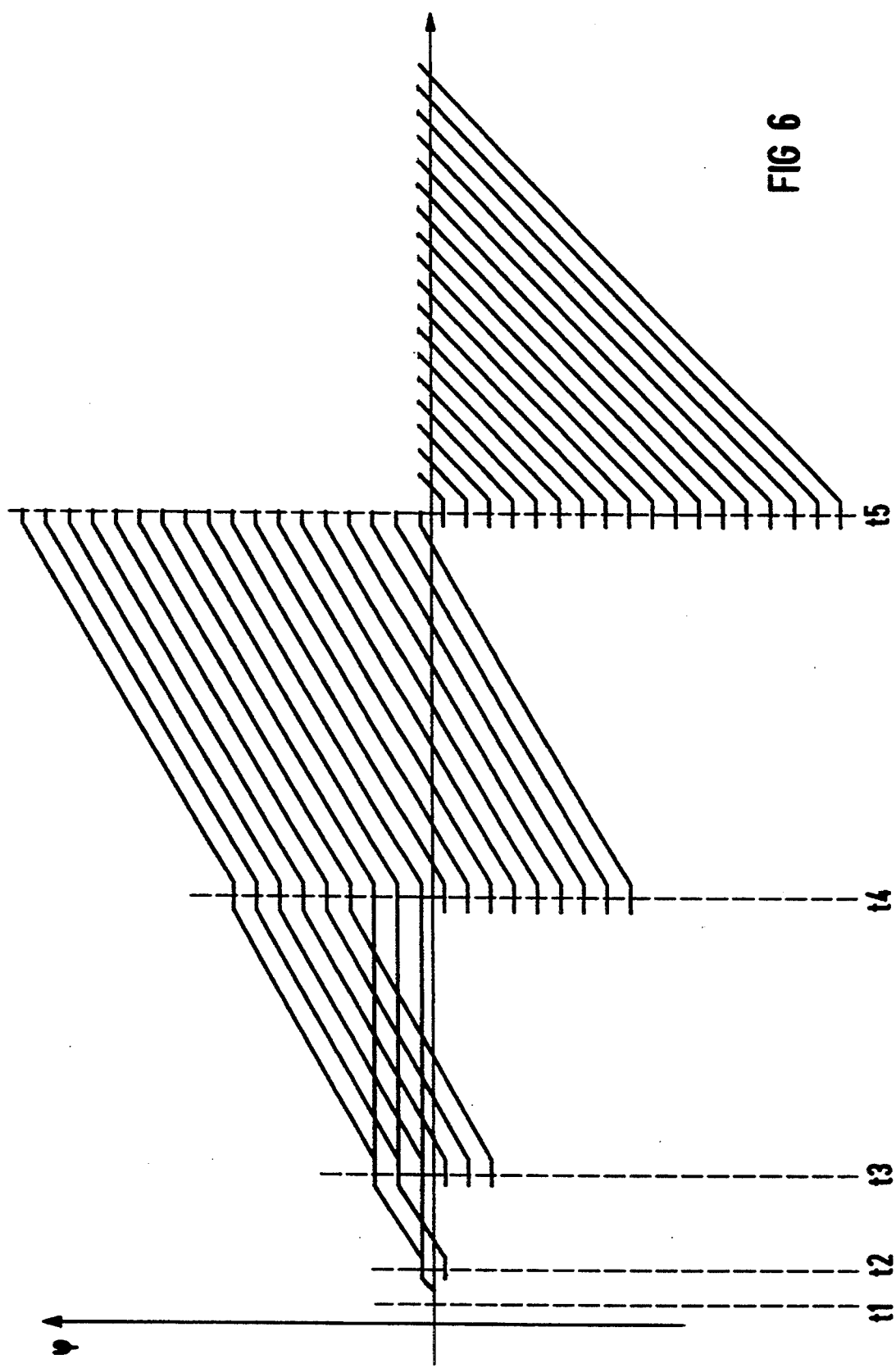

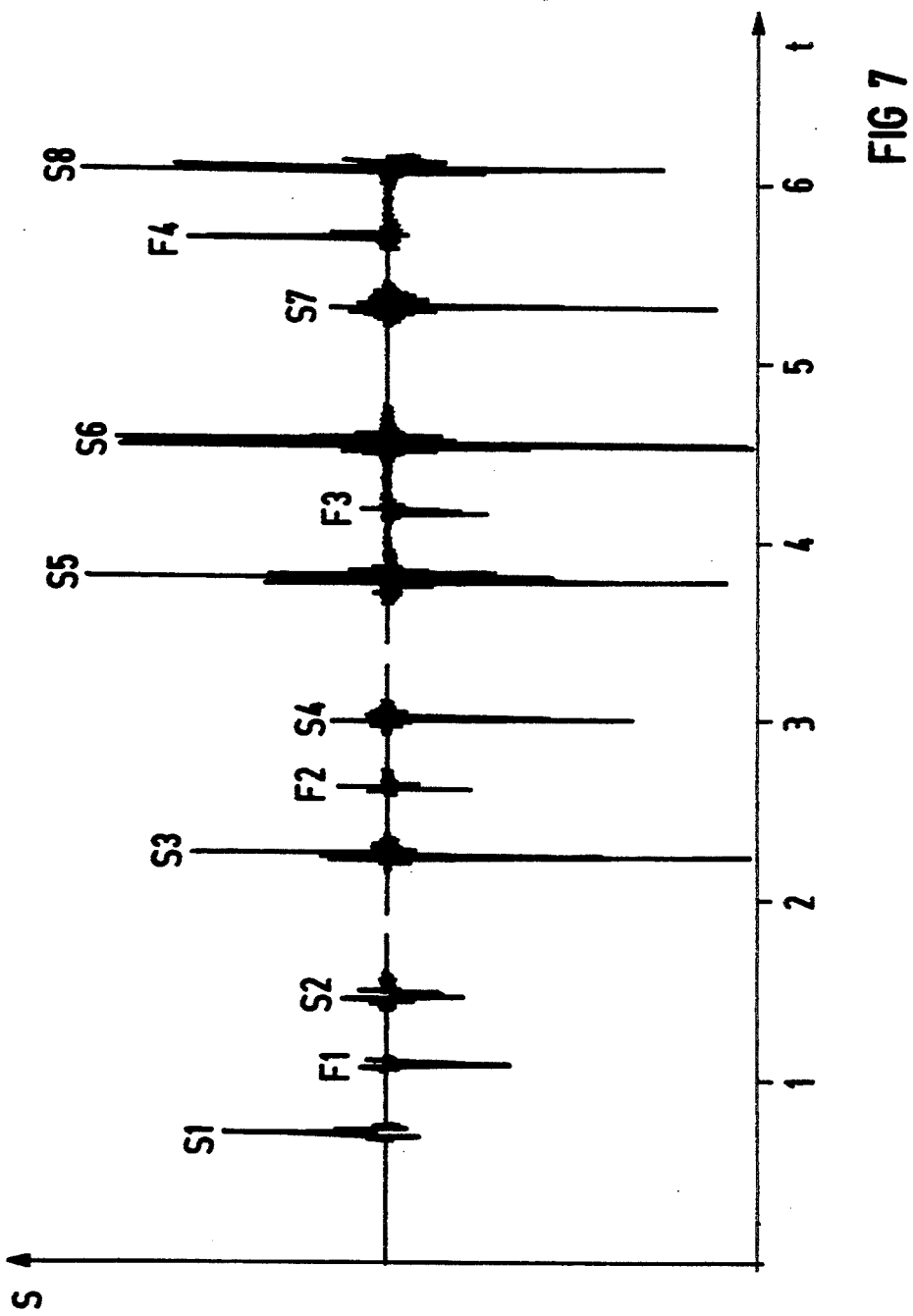

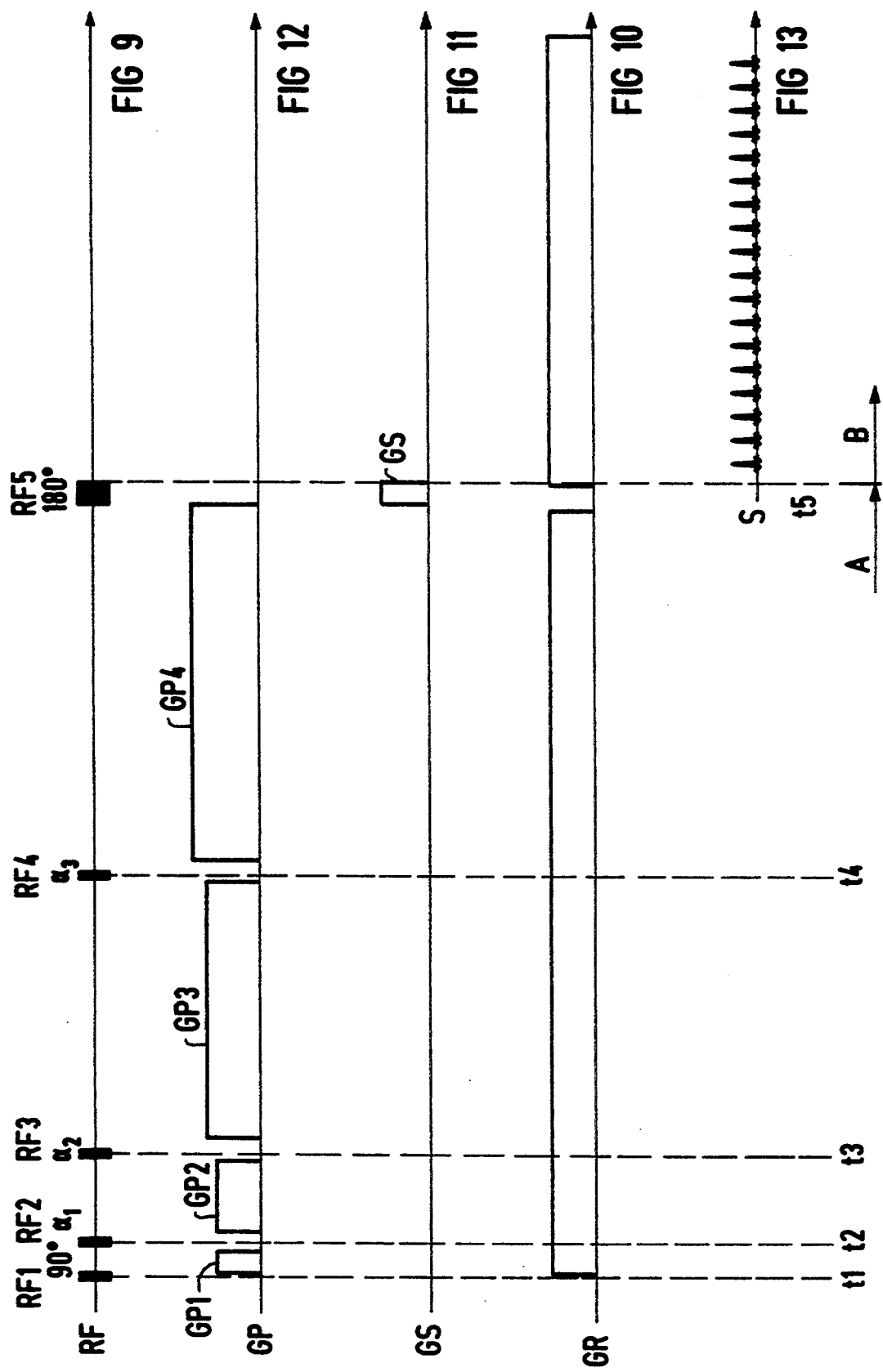

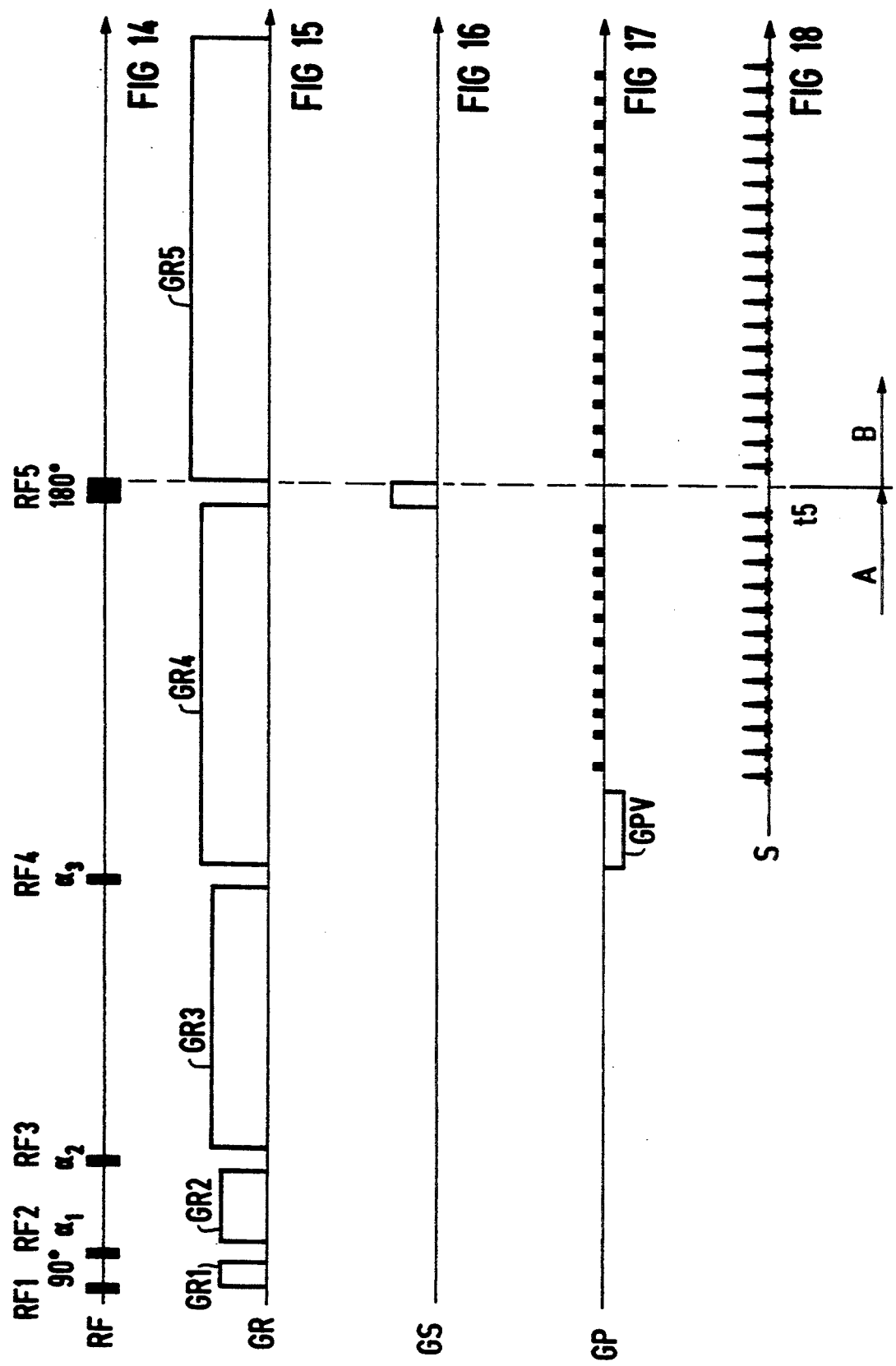

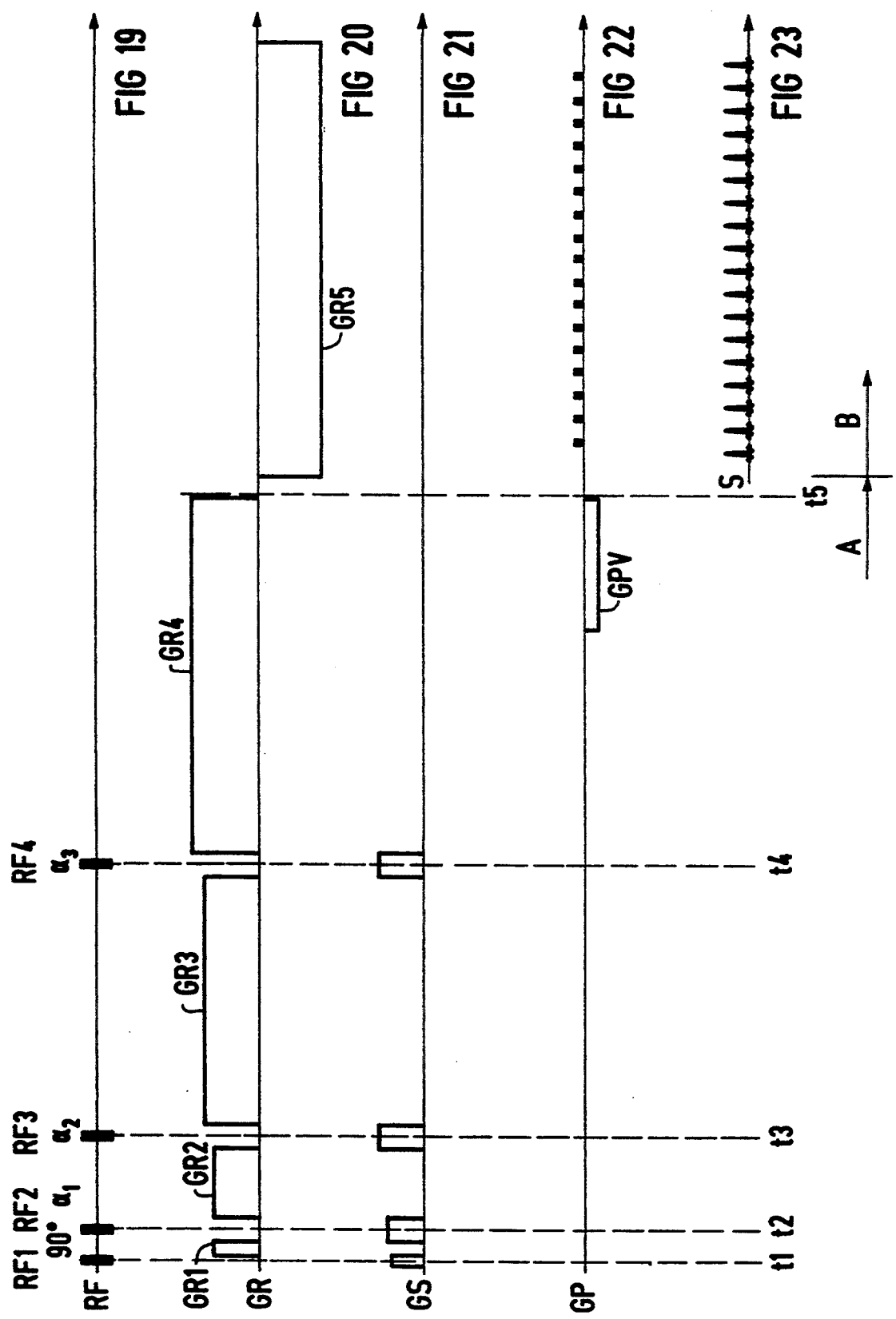

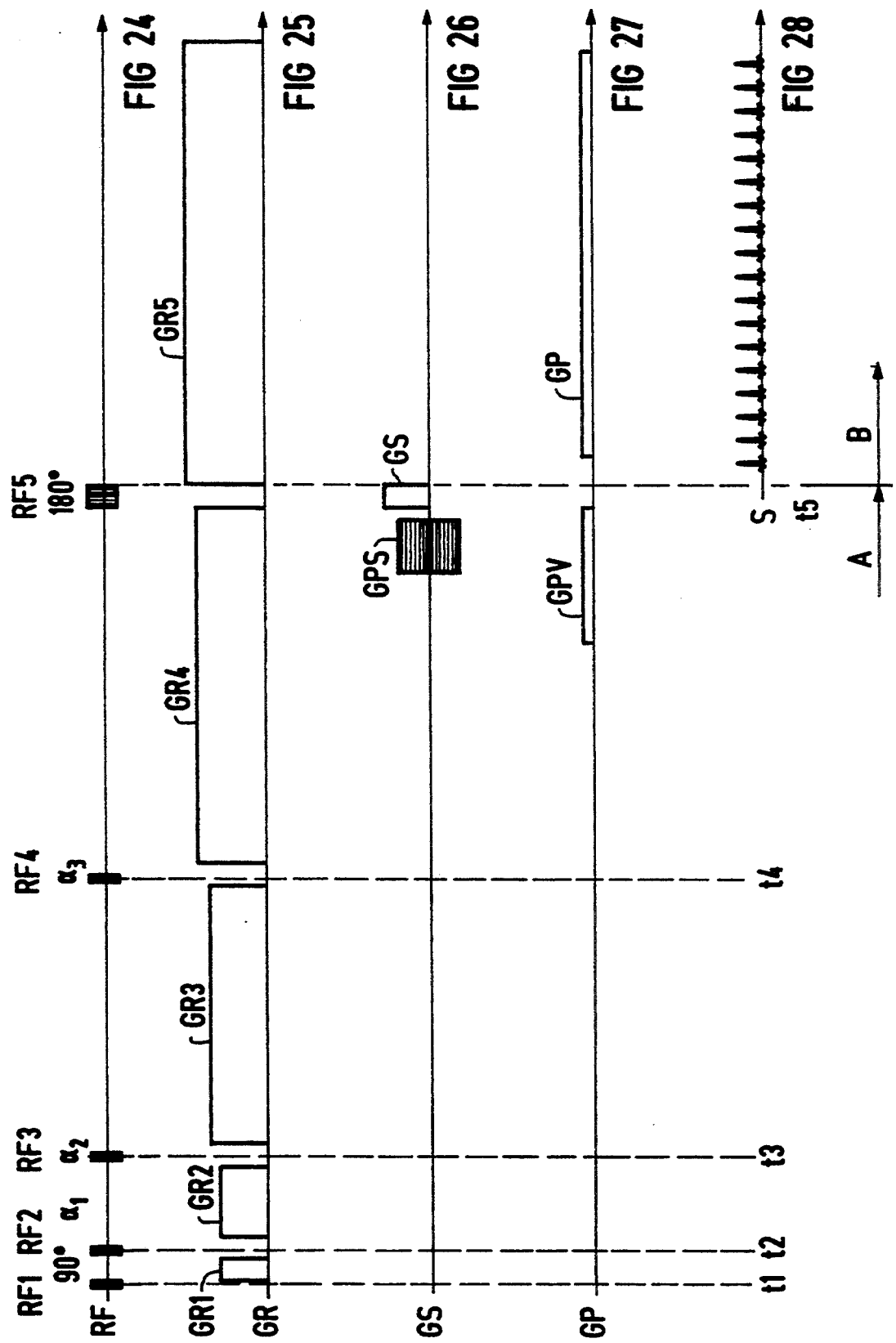

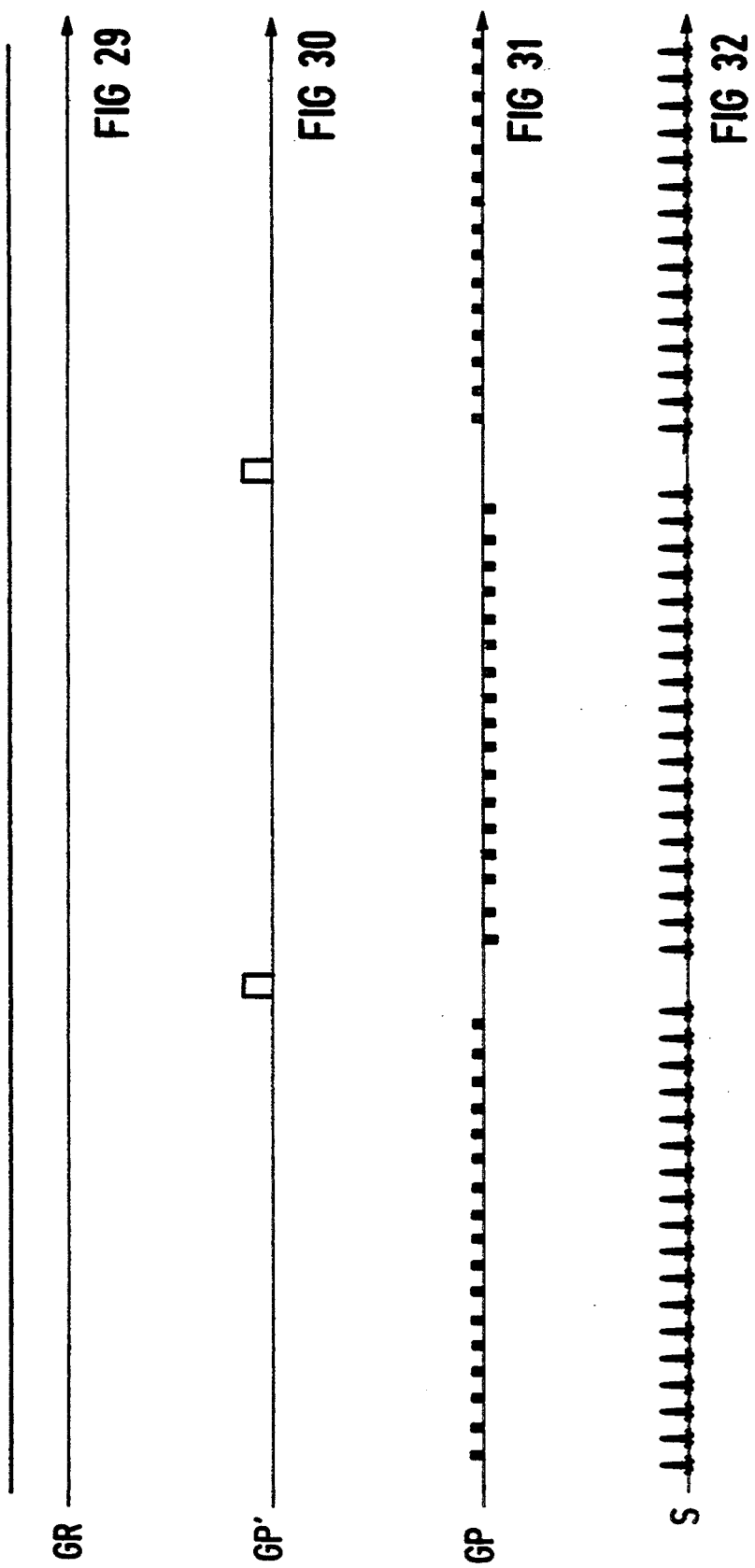

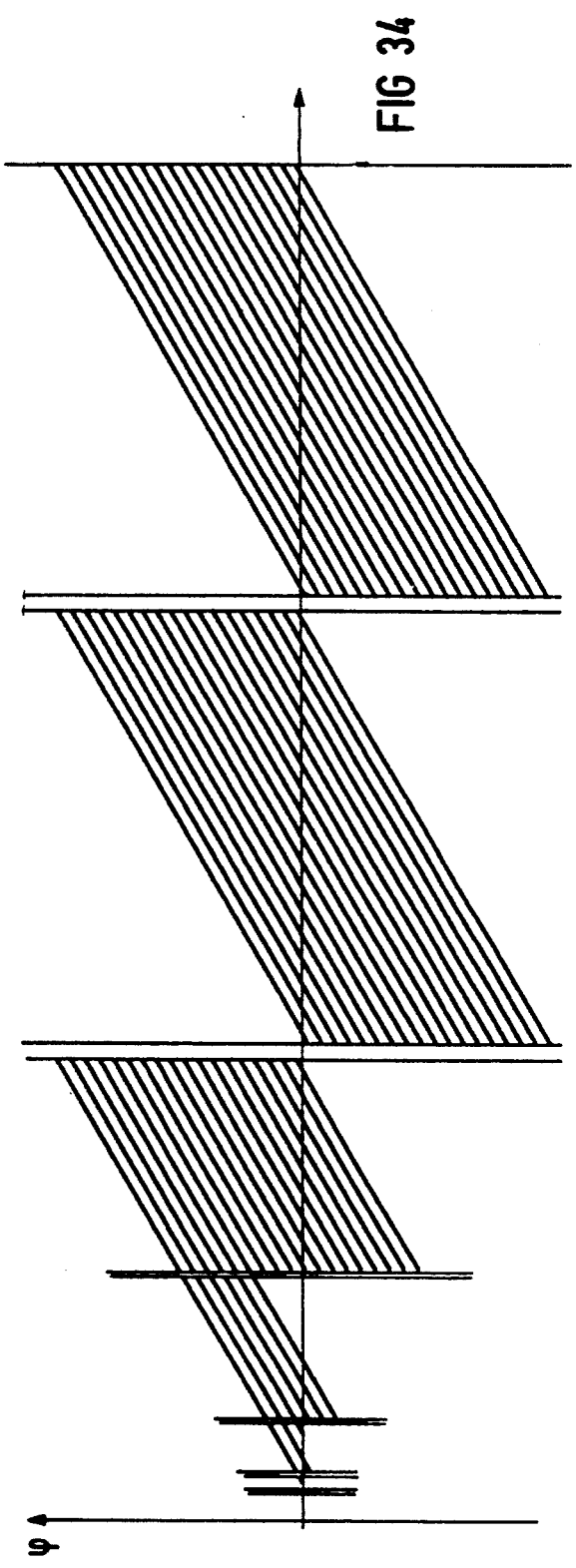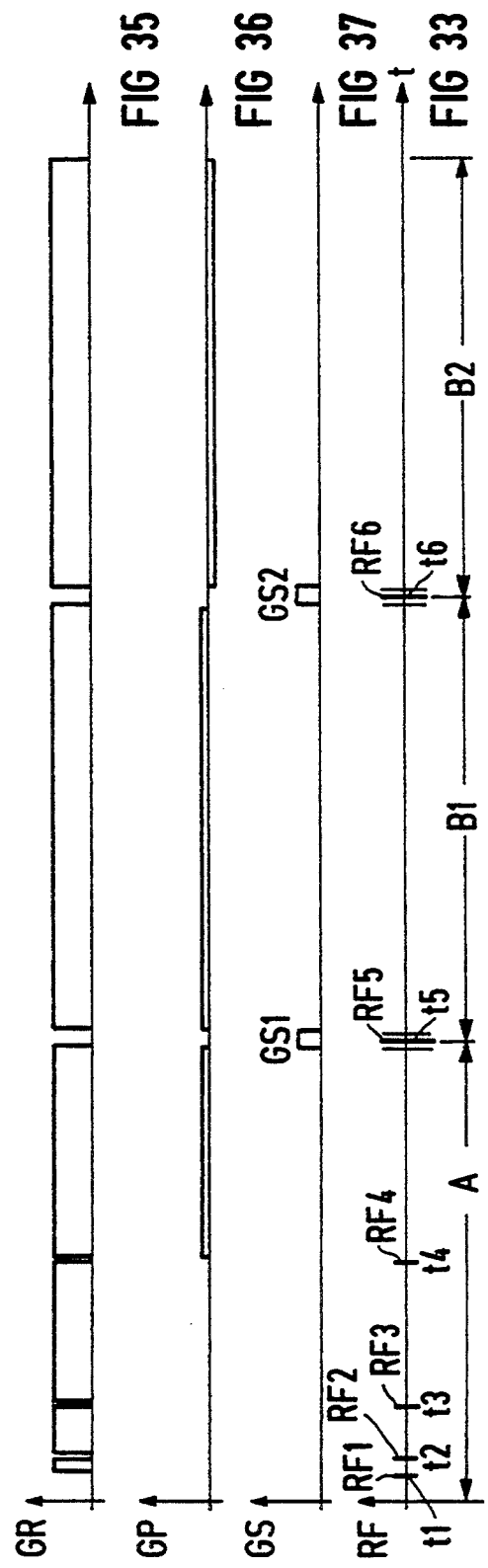

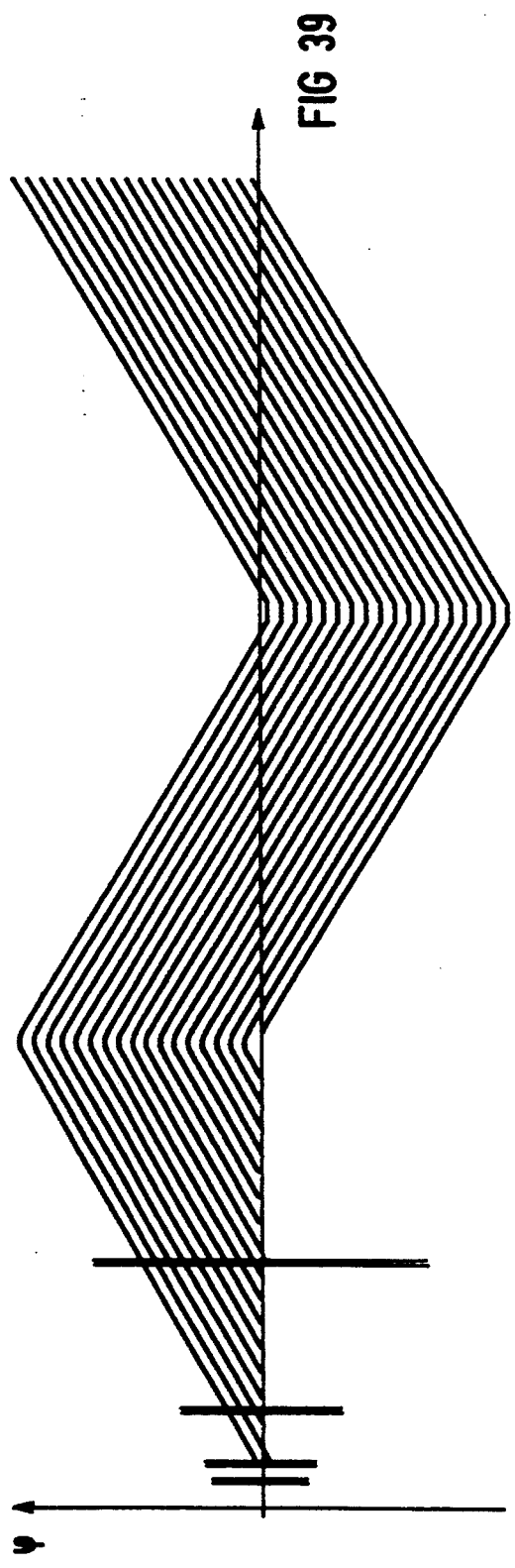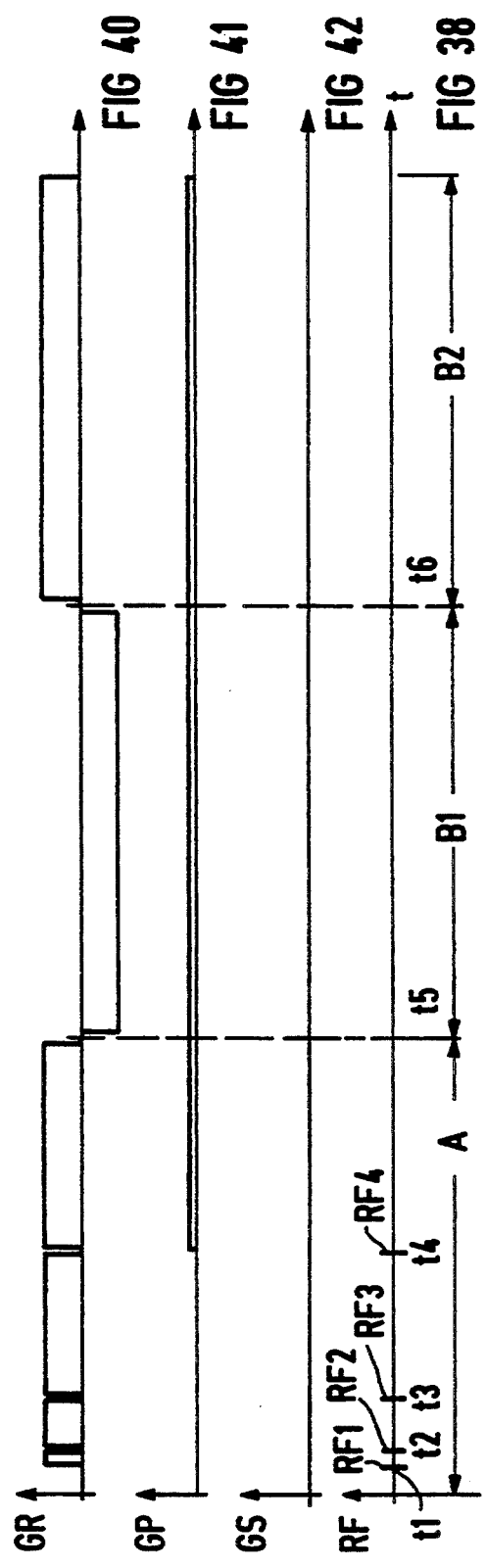

PULSE SEQUENCE FOR A NUCLEAR MAGNETIC RESONANCE APPARATUS

This is a continuation of application Ser. No. 08/028,808, filed Mar. 10, 1993, now abandoned.

BACKGROUND OF THE INVENTION

1. Field Of the Invention

The present invention is directed to method for operating a magnetic resonance imaging apparatus in accordance with a specified pulse sequence.

2. Description of the Prior Art

Short image pick-up times are of special significance in nuclear magnetic resonance tomography. This is true not only for obtaining an optimally high patient throughput but also, for example, in order to avoid motion artifacts. Short image pick-up times are indispensable for certain pick-up techniques, for example, cine mode (taking moving pictures).

Of methods currently known, the shortest image pick-up times (30 through 100 ms) can be achieved with the EPI method. The EPI method is described, for example, in European Patent 0 076 054.

In a typical EPI sequence, an examination subject is exposed to an RF excitation pulse in a first direction under the influence of a slice selection gradient at the beginning of the pulse sequence. Nuclear spins are thereby excited in a slice of the examination subject. After the excitation, a phase-coding gradient is activated in a second direction and a read-out gradient is activated in a third direction. The first, second and third directions reside perpendicularly relative to one another. The read-out gradient is composed of a pre-phasing pulse as well as of sub-pulses of alternating polarity. The nuclear spins are dephased and in turn rephased in alternation as a result of this alternating polarity of the read-out gradient, so that a sequence of nuclear magnetic resonance signals arises. So many signals are thereby acquired after a single excitation that the entire Fourier k-space is scanned, i.e. the existing data are adequate for reconstructing a complete tomogram.

The phase-coding gradient is briefly activated at every change in the polarity of the read-out gradient. The phase relation of the nuclear spins is thus advanced by one step every time.

The nuclear magnetic resonance signals that arise are sampled in the time domain, are digitized, and the numerical values acquired in this way are entered into a raw data matrix. An image of the examination subject is then reconstructed from this raw data matrix on the basis of a two-dimensional Fourier transformation.

The speed advantage of the EPI method arises essentially because a plurality of signals that are adequate for the reconstruction of a complete tomogram are acquired after a single excitation. All signals that ultimately represent gradient echoes must be acquired within the T2* decay. The read-out gradient must therefore be very rapidly bipolarly switched, so that considerable technological demands are made of the system, which constitutes a disadvantage of the EPI method.

In comparison to spin echoes, gradient echoes of the type generated in the EPI method also have the disadvantage of being sensitive to local field inhomogeneities.

German Patent 38 23 398, corresponding to U.S. Pat. No. 5,126,673, discloses a pulse sequence wherein a sequence of many equidistant RF pulses, referred to as a pulse burst, is used in order to excite a specimen. The RF pulses have an extremely small flip angle on the order of magnitude of 0.1° through 2°. A train of equidistant echo signals with optimally constant amplitude is obtained following upon the sequence of RF pulses. In order to keep the amplitude of the echo signals as constant as possible, the amplitude and phase of the RF pulses are influenced. A selected excitation refocusing, as well as read-out and phase-coding gradients are provided for the imaging.

The possibility is also mentioned of omitting a relatively large number of RF pulses from the equidistant sequence of RF pulses. According to the disclosure of the aforementioned patent, a minimization of the number of RF pulses can be achieved when the spacing between the RF pulses is varied corresponding to the sequence 1, 3, 5, 9, 17 ... n, with $n=2^{m-1}+1$. The omission of RF pulses in the sequence of fundamentally equidistant RF pulses, however, is considered as being disadvantageous since the amplitude constancy of the echo signals is much more difficult to optimize than given a pulse burst composed of a gap-free sequence of RF pulses.

The non-equidistant radio frequency pulse sequence recited in the aforementioned patent also present the disadvantage that a number of echoes respectively coincide in the read-out phase, so that a clean evaluation for image acquisition is practically impossible. Moreover, the signal-to-noise ratio becomes extremely unfavorable in the excitation due to the small flip angles.

SUMMARY OF THE INVENTION

It is an object of the present invention to provide a method for operating a magnetic resonance imaging apparatus in the form of a pulse sequence wherein short image pick-up times comparable to the EPI method are achieved, but wherein the technological demands made of the nuclear magnetic resonance apparatus remain low, particularly in view of the gradient electronics.

This object is achieved in accordance with the principles of the present invention in a method for operating a magnetic resonance imaging apparatus wherein a sequence of excitation pulses is generated during the excitation phase, with a first gradient being activated in a first direction at least in the pauses between the excitation pulses, the gradient areas of this first gradient being respectively different between successive excitation pulses. A 180° radio frequency pulse is then activated. The resulting nuclear magnetic resonance signals are then read out during the read-out phase under a read-out gradient, the read-out gradient having at least one component in the first direction. The nuclear magnetic resonance signals are then analyzed according to amplitude and phase, and an image is generated therefrom.

In accordance with the invention, up to $3^k$ nuclear magnetic resonance signals can thereby be acquired after $K+1$ RF pulses. Enough signals for scanning the entire k-space can thus be measured with a comparatively low number of radio frequency pulses in a read-out phase. Further, pure spin echoes can be acquired, these being insensitive to local field inhomogeneities in comparison to gradient echoes.

In a preferred embodiment, the gradient areas between two respective excitation pulses, sorted according to size, increase at least by the factor 3. It is thereby assured that the arising echoes are separated. Disturbances due to superimposition of echoes are thus avoided and the maximum number of echoes is obtained for a given time of the excitation phase. The excitation phase can be selected shortest with a given number of echo signals when the gradient area increases exactly according to the function $3^n$.

A scaling of the different amplitudes of the arising nuclear magnetic resonance signals can be implemented by acquiring reference values without phase coding. To that end, two sets of nuclear magnetic resonance signals can be acquired in a further preferred embodiment, only one set thereof being phase-coded and the non-phase-coded set of nuclear magnetic resonance signals being employed as reference values for the signal amplitude. In order to shorten the data pick-up time for the non-phase-coded set of nuclear magnetic resonance signals, only the number of non-phase-coded nuclear magnetic resonance signals as is necessary for an acquisition of the amplitude distribution is acquired in a further embodiment, by exploiting symmetries in the amplitude curve of the nuclear magnetic resonance signals.

A number of read-out phases (B1, B2) can be implemented after one excitation phase (A), by activating at least one further 180° RF pulse after the first read-out phase and acquiring nuclear magnetic resonance signals after every further 180° RF pulse during a further read-out phase, the signals being acquired under a read-out gradient having at least one component in the first direction. Alternatively, the read-out gradient can be reversed at least once after the first read-out phase and nuclear magnetic resonance signals under the influence of the read-out gradient can be acquired during at least one further read-out phase.

DESCRIPTION OF THE DRAWINGS

FIGS. 1, 2, 3, 4 and 5 respectively show the radio frequency pulses, the read-out gradient, the slice selection gradient, the phase-coding gradient and the resulting nuclear magnetic resonance signals generated in accordance with the method of the invention.

FIG. 6 shows the phase curve of the nuclear spins given the application of a pulse sequence according to FIGS. 1 through 4.

FIG. 7 is an example of an actual nuclear magnetic resonance signal obtained in accordance with the inventive method in the read-out phase.

FIGS. 9, 10, 11, 12 and 13 respectively show the radio frequency pulses, the readout gradient, the slice selection gradient, the phase-coding gradient and the resulting nuclear magnetic resonance signals generated in accordance with the principles of the present invention wherein phase-coding ensues during the excitation phase.

FIGS. 14, 15, 16,17 and 18 respectively show the radio frequency pulses, the read-out gradient, the slice selection gradient, the phase-coding gradient and the resulting nuclear magnetic resonance signals generated in accordance with the inventive method wherein the nuclear magnetic resonance signals are read out during the excitation phase.

FIGS. 19, 20, 21, 22 and 23 respectively show the radio frequency pulses, the read-out gradient, the slice selection gradient, the phase-coding gradient and the resulting nuclear magnetic resonance signals generated in accordance with the inventive method wherein a reversal of the read-out gradient takes place instead of a 180° pulse.

FIGS. 24, 25, 26, 27 and 28 respectively show the radio frequency pulses, the read-out gradient, the slice selection gradient, the phase-coding gradient and the resulting nuclear magnetic resonance signals in accordance with the inventive method in a first embodiment for generating a three-dimensional image.

FIGS. 29, 30, 31 and 32 respectively show the read-out gradient, two phase-coding gradients and the resulting nuclear magnetic resonance signals in accordance with the inventive method in a second embodiment of a pulse sequence for generating a three-dimensional image.

FIGS. 33 through 37 respectively show pulses and signals in a further embodiment of a pulse sequence in accordance with the invention wherein two read-out phases take place after one excitation phase by applying a further 180° radio frequency pulse.

FIGS. 38 through 42 respectively show signals and pulses in another embodiment in accordance with the inventive method wherein two read-out phases take place due to reversal of the read-out gradient following one excitation phase.

DESCRIPTION OF THE PREFERRED EMBODIMENTS

Figure 8:
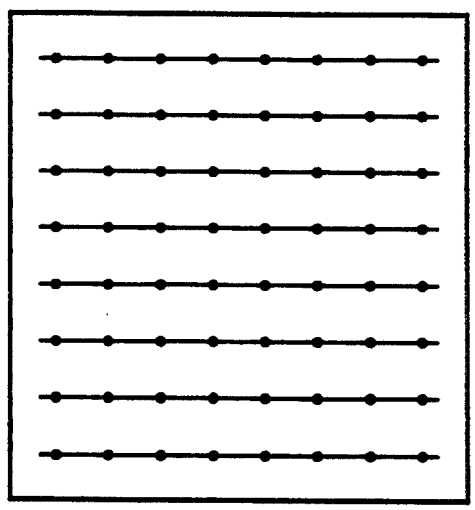
FIG. 8 is a schematic diagram of a raw data matrix employed in accordance with the inventive method.

In the exemplary embodiment of FIG. 1, four radio frequency pulses RF1, RF2, RF3 and RF4 are successively generated at respective times t1, t2, t3 and t4, to which an examination subject is exposed during an excitation phase A. The chronological spacing between any two radio frequency pulses RF increases from radio frequency pulse to radio frequency pulse. When the radio frequency pulses RF 1 through RF4 have a flip angle of 90°, the nuclear magnetic resonance signals have a maximum amplitude in the following read-out phase B. In order to improve the amplitude distribution of the nuclear magnetic resonance signals (as discussed below) it can be more beneficial if only the first radio frequency pulse RF1 has a flip angle of 90° and the other radio frequency pulses RF2 through RF4 have a flip angle between 60° and 90°. At any rate, it is beneficial for the signal-to-noise ratio when the sum of the flip angles of all radio frequency pulses lies significantly above 180°. A further radio frequency pulse RF5 having a flip angle of 180° follows at time t5. The entire, previously excited spin system is thus inverted in phase. The radio frequency pulse RF5 is frequency-selective. Since a slice selection gradient GS according to FIG. 3 is simultaneously activated, the radio frequency pulse RF5 only influences one slice of the examination subject.

According to FIG. 2, gradients GR1 through GR4 in the read-out direction are activated between each two successive radio frequency pulses in the sequence RF1 through RF5. A gradient GR5 is likewise activated in read-out direction during the read-out phase following the radio frequency pulse RF5.

The phase curve of the spins arising due to the radio frequency pulses RF1 through RF5 according to FIG. 1 as well as under the influence of the gradient pulses GR1 through GR5 is shown in FIG. 6. The times t1 through t5 are likewise entered in FIG. 6 in order to show the chronological relationship between the illustration of FIG. 6 and the pulse sequence of FIGS. 1 through 5.

The phase of the spins excited at time t1 with the radio frequency pulse RF1 continuously increases at first under the influence of the gradient GR1. At time t2, another radio frequency pulse RF2 acts on the already excited spins. According to the partition model of Woessner (described in J. Chem. Phys. 34, 2057, 1961), the primary spin magnetization produced with the radio frequency pulse RF1 is thus split into three components with respect to the phase: the phase is partly inverted, remains partly unmodified and the magnetization is partly brought into a z-position that cannot be influenced by gradients. These three components of the spin magnetization are again subjected to an excitation with the third radio frequency pulse RF3 at time t3. A division into the aforementioned, three components thus again ensues for all three components of the spin magnetization, so that a total of nine different components of the spin magnetization are now present. Another splitting of each component into three further components ensues at time t4 due to a further radio frequency pulse RF4. Eighteen components with different phase relations are thus available at time t5. (The FID signals generated by the radio frequency pulses RF2 through RF4 have not been considered for clarity.) These signals can also be utilized for generating the image. All spin magnetizations are inverted at time t5 due to the 180° radio frequency pulse RF5. This, however, is only true of the selected slice due to the selective lock-on of the 180° radio frequency pulse RF5.

Following the radio frequency pulse RF5, the phases of the individual components of the spin magnetization again increase linearly under the influence of the simultaneously activated gradient GR5. As may be seen in FIG. 6, the individual components of the spin magnetization exhibit a zero-axis crossing of the phase at different times. The zero-axis crossing of the phase is equivalent to a focusing at which a nuclear magnetic resonance signal arises. The nuclear magnetic resonance signals arising during the read-out phase B are illustrated in FIG. 5. Eighteen signals were thus generated with four radio frequency excitation pulses RF1 through RF4 as well as one 180° radio frequency pulse RF5. Generally speaking, this ensues due to the splitting of the respectively existing spin magnetization as a result of the excitation pulses following the first excitation pulse and as a result of chronologically graduated focusing of the individual sub-groups that thus arise. Due to the read-out gradient GR5 activated during the read-out phase, the arising signals contain phase information with respect to the direction of the read-out gradient GR5. A topical pre-selection to a specific slice has already ensued due to the slice-selectivity of the 180° radio frequency pulse RF5. The read-out gradient GR5 preferably resides perpendicularly to the slice-selection gradient GS, so that a directional coding within the selected slice with respect to the phase relation ensues with the read-out gradient GR5.

A phase coding in a third spatial direction must also ensue for three-dimensional topical resolution. According to FIG. 4, individual pulses of a phase-coding gradient GP can be respectively activated between the signals for that purpose, so that a phase coding with respect to the direction of the phase-coding gradient, which preferably lies perpendicularly with respect to the directions of the read-out gradient GR5 and of the slice-selection gradient GS, ensues. In order that the zero-axis crossing of the phase coding lies in the middle line of the raw data matrix yet to be set forth below, a pre-phasing pulse GPV is provided in the excitation phase A. The effect of this pre-phasing pulse GPV is inverted by the 180° radio frequency pulse RF5, so that a negative pre-phasing arises, whose effect is in turn cancelled step-by-step by the individual pulses of the phase-coding gradient GP during the read-out phase B. The area of the pre-phasing pulse GPV is dimensioned such that it is equal to the sum of the individual pulses GP up to the middle of the read-out phase B.

The nuclear magnetic resonance signals S shown in FIG. 5 are sampled in the time domain, are digitized, and the numerical values acquired in this way are entered into a raw data matrix according to FIG. 8. The raw data matrix can be considered to be a measured data space, e.g. a measured data plane in the two-dimensional case present in the exemplary embodiment. This measured data space is generally referred to as "k-space" in nuclear magnetic resonance tomography.

The information about the spatial origin of the signal contributions S needed for the imaging is coded in the phase factors, whereby the relationship between the locus space (i.e., the image) and the k-space exists mathematically via a two-dimensional Fourier transformation expressible as:

$$S(k_x, k_y) = \int\int \zeta(x, y)\exp(i(k_x x + k_y y))dxdy.$$

The following definitions apply:

$$k_x(t) = \gamma \int_O^t G_x(t')dt' \text{ and } k_y(t) = \gamma \int_O^t G_y(t')dt', \text{ wherein}$$

$\gamma$ = gyromagnetic relationship
$G_x(t')$ = momentary value of the read-out gradient GR5, and
$G_y(t')$ = momentary value of the phase-coding gradient PC.

In the raw data matrix shown in FIG. 8, each line corresponds to an individual signal S.

Due to the step-by-step incrementing of the phase-coding gradient GP according to FIG. 4, the scanning in the k-space ensues in successive lines, beginning with the line 0. If the phase-coding gradient GP were maintained activated during the read-out phase, then an "oblique" line scanning would ensue in the k-space.

An image matrix on the basis of which an image reconstruction then ensues is acquired in a known manner by two-dimensional Fourier transformation from the raw data matrix shown in FIG. 8.

The signals arising during the read-out phase (only schematically shown in FIG. 5) are shown with reference to an actually produced plot in FIG. 7. The evaluated signals are referenced 1 through 8; the signals derived from the FID signals of the radio-frequency pulses RF2 through RF5 are referenced F1 through F4 and are not evaluated in the illustrated exemplary embodiment, even though this would be fundamentally possible. It is thus clear that the individual signals exhibit an irregular amplitude distribution. Without further measures, this would lead to artifacts in the image reconstruction. In fact, a scaling on the basis of different attenuations or amplifications in the signal processing is therefore necessary in order to achieve a uniform amplitude distribution. Such measures, however, involve sacrifices in the signal-to-noise ratio.

An improvement of the amplitude distribution of the generated nuclear magnetic resonance signals is also possible without this disadvantage on the basis of a selection of the radio frequency pulse strengths of the radio frequency pulses RF 1 through RF4 as well as their phases. The amplitude distribution can be improved on the basis of empirical procedures. For example, a flip angle distribution of 90°-75°-75°-90° has proven beneficial for four radio frequency pulses; a smallest variation of the echo amplitudes of 6.96:1 is thus obtained.

It will be understood that the previous explanations and figures refer to four excitation pulses RF 1 through RF4, but in practice, more excitation pulses must be utilized in order to obtain the number of lines in the k-space needed for an adequate topical resolution with a single excitation and read-out phase. Typically, for example, 128 or 256 lines are employed, so that a corresponding number of signals S must be generated.

The disclosed method makes low demands of the gradient electronics, since no fast switching of the read-out gradient is required. In the embodiment of FIG. 4, only the phase-coding gradient GP must be rapidly switched. By comparison to read-out gradients, however, phase-coding gradients have a substantially lower amplitude, so that the demands made of the gradient electronics remain low. The pick-up time lies approximately in the area of the EPI method. Pure spin echoes that are insensitive to local field inhomogeneities arise in the described exemplary embodiment.

The phase coding can also ensue during the excitation phase. A corresponding pulse sequence is shown in FIGS. 9 through 13. Differing from the exemplary embodiment of FIGS. 1 through 5, one individual pulse GP1 through GP4 of a phase-coding gradient GP is respectively activated during the excitation phase A in the gaps between two successive radio frequency pulses in the sequence RF1 through RF5 (FIG. 12). A phase-coding gradient GP is no longer activated during the read-out phase B. Since the nuclear spins have a "phase memory", they also retain the locus-dependent phase information impressed on them during the excitation phase A during the read-out phase, so that this phase information can be evaluated for topical resolution.

This arrangement has the advantage that the switching times of the individual pulses of the phase-coding gradient GP become longer than in the exemplary embodiment of FIGS. 1 through 5.

Differing from the exemplary embodiment according to FIG. 2, the gradient GR remains activated in the pulse sequence of FIG. 9 during the entire excitation phase, with the exception of the cut-in time of the radio-frequency pulse RF5. In order to thereby avoid an undesirable slice selection in a direction perpendicular to the direction of the gradient GR, the radio-frequency pulses RF 1 through RF4 must be extremely broadband in this embodiment.

As may be seen in FIG. 6, a zero-axis crossing of the phases of the nuclear spins also already occurs during the excitation phase A, i.e. a rephasing. Nuclear magnetic resonance signals thereby also arise, but these are not shown in FIG. 5 since they are not evaluated in the exemplary embodiment set forth therein. However, it is possible also to evaluate the nuclear magnetic resonance signals arising during the excitation phase A, particularly between the times t4 and t5. Such an exemplary embodiment is shown in the pulse diagrams of FIGS. 14 through 18. The radio frequency pulses RF1 through RF5, the read-out gradient GR and the slice selection gradient GS in FIGS. 14 through 16 are thereby switched in the same way as in the exemplary embodiment of FIGS. 1 through 3. Differing from FIG. 5, nuclear magnetic resonance signals S during the excitation phase A are also shown in FIG. 18. In order to be able to utilize these nuclear magnetic resonance signals for the spatial evaluation, they must also be phase-coded. To that end, individual pulses of the phase-coding gradient GP are also provided during the excitation phase A according to FIG. 17. The pre-phasing pulse GPV must be switched before the first of these individual pulses.

A locus-dependent phase that is stored at the beginning of the read-out phase is thereby impressed on the nuclear spins with the phase-coding gradients GP1 through GP4. All signals thus exhibit locus-dependent phase information that is utilized for calculating the image. Given an unaltered measuring time in comparison to the exemplary embodiment of FIGS. 1 through 5, additional signals can be acquired with this pulse sequence.

A rephasing of the nuclear spins can be achieved not only on the basis of a 180° radio frequency pulse but, alternatively, by a gradient reversal in a known way. FIGS. 19 through 23 show an exemplary embodiment of a pulse sequence having gradient reversal. Differing from FIG. 1, the 180° pulse RF5 is omitted in the sequence of radio-frequency pulses RF. Instead, the direction of the read-out gradient GR5 is inverted with respect to the gradients GR1 through GR4. The nuclear magnetic resonance signals S of FIG. 23 thus no longer arise as spin echoes, but instead arise as gradient echoes. The evaluation, however, can ensue as in the exemplary embodiment of FIGS. 1 through 5.

As shown in FIG. 21, the slice selection gradient GS in this exemplary embodiment is also activated at each radio frequency pulse RF1 through RF4. Each radio frequency pulse RF1 through RF4 is frequency-selective, so that, under the influence of the allocated slice-selection gradient, it only acts on a prescribed slice of the examination subject. As shown in FIG. 22, the pre-phasing pulse GPV in this exemplary embodiment must also be inverted in comparison to the individual pulses of the phase-coding gradient GP, since differing from the exemplary embodiment of FIGS. 1 through 5 its effect is not inverted by a 180° radio frequency pulse.

Due to the short measuring time, the illustrated method is available for acquiring three-dimensional image information. To this end, a phase coding must also ensue in a second direction.

A first exemplary embodiment of a pulse sequence for generating three-dimensional image information is shown in FIGS. 24 through 28. With respect to the radio frequency pulses RF1 through RF5 shown in FIG. 24 as well as with respect to the gradients GR1 through GR5 shown in FIG. 25, this pulse sequence coincides with the exemplary embodiment of FIGS. 1 and 2. As in FIG. 4, a pre-phasing gradient in phase-coding direction GPV is also provided. The phase-coding gradient GP in this exemplary embodiment remains activated during the read-out phase. This is not necessarily related to the three-dimensional imaging but is merely intended to disclose an alternative to the step-by-step incrementation of the phase according to FIGS. 4, 17 and 22.

In order to acquire three-dimensional image information, the illustrated sequence must be repeated n times with different values of a phase-coding gradient in a second direction. This is indicated in FIG. 26 by a plurality of steps of the second-phase coding gradient GPS. In this exemplary embodiment, the 180° radio frequency pulse RF5 likewise collaborates with a slice-selection gradient GS. In this case, however, it cannot act only on a thin slice, but must act on a thick slice or wafer within which the three-dimensional resolution is to ensue. This can be achieved by an appropriate selection of the frequency bandwidth of the 180° radio frequency pulse RF5.

It is also possible already to acquire enough signals for the three-dimensional imaging after a single excitation phase. Such an exemplary embodiment is shown in FIGS. 29 through 32, whereby the excitation phase has been omitted for clarity. This can coincide, for example, with the excitation phase A of FIGS. 1 through 4, but the 180° radio frequency pulse RF5 must also act on a thick slice within which a three-dimensional resolution ensues.

In the exemplary embodiment of FIGS. 29 through 32, a phase-coding pulse GP' is activated in a second direction following a plurality of n signals S according to FIG. 32 that are phase-coded in a first direction by respective individual pulses of a first phase-coding gradient GP according to FIG. 31. The phase of the nuclear spins is thus varied step-by-step in the second direction. The direction of the second phase-coding gradient GP' resides perpendicularly to the respective directions of the first phase-coding gradient GP and the read-out gradient GR. The direction of the individual pulses of the first phase-coding gradient GP is inverted after every pulse of the second phase-coding gradient GP', so that a meandering scanning of the three-dimensional k-space ensues. n.m locus-coded signals are acquired between two individual pulses of the second phase-coding gradient GP'. This is implemented p times with phase switching because of the second phase-coding gradient GP', so that a three-dimensional n.m.p raw data matrix is ultimately available from which an image having three-dimensional locus information can be acquired by three-dimensional Fourier transformation.

The fact that the read-out phase in the disclosed method is extremely short makes it possible to implement a plurality of read-out phases within the T2* decay of the nuclear magnetic resonance signals following one excitation phase.

A first such exemplary embodiment is shown in the pulse sequence according to FIGS. 33 through 37. FIG. 33 shows the radio frequency pulses RF; FIG. 34 shows the phase response of the nuclear spins analogous to FIG. 6; FIG. 35 shows the course of the read-out gradient GR; FIG. 36 shows the course of the phase-coding gradient GP; and FIG. 37 shows the course of the slice-selection gradient GS. The arising nuclear magnetic resonance signals are not shown for clarity.

Until time t6, the pulse sequence corresponds to that according to FIGS. 1 through 5 with the exception of the phase-coding gradient GP, which is not activated in blips in FIG. 36 but instead is activated continuously. A second 180° pulse RF6 together with a slice-selection gradient GS2 are activated at time t6, i.e. following the last nuclear magnetic resonance signal of the read-out phase B1. The phase relations of the nuclear spins are thus inverted in accord with the illustration of FIG. 34. Just as the first 180° radio frequency pulse RF5, the second 180° radio frequency pulse RF6 acts slice-selectively.

A second read-out phase B2 now ensues wherein the phase of the spins again running upwardly in accord with the illustration of FIG. 34 under the action of a read-out gradient GR. As set forth above, a nuclear magnetic resonance signal arises at every zero-axis crossing of the phase; this nuclear magnetic resonance signal, however, is not shown in the figures for clarity. The same number of nuclear magnetic resonance signals as in the first read-out phase B1 can thus be acquired in the second read-out phase B2. A phase-coding gradient GP, whose direction is inverted compared to the first read-out phase B1, is also activated during the second read-out phase B2. Regions of the k-space that were not yet covered in the first read-out phase B1 can be scanned on the basis of an appropriate dimensioning of the read-out and of the phase-coding gradients GR and GP. When, however, the entire k-space was already scanned in the first read-out phase B1, the same k-space can also be scanned again in the read-out phase B2 in order, for example, to acquire images of the same slice that follow one another in tight chronological proximity or in order to scan slices selected by dimensioning the slice-selection gradient GS.

More than two read-out phases B can also be implemented on the basis of a multiple application of 180° radio frequency pulses.

One also obtains a plurality of read-out phases following a single excitation phase on the basis of a gradient reversal with a pulse sequence according to FIGS. 38 through 42. Until time t6, this pulse sequence corresponds to the pulse sequence according to FIGS. 19 through 23, whereby the phase-coding gradient GP is again activated not in the form of blips but continuously. The direction of the read-out gradient GR is inverted and the phases of the nuclear spins again runs upwardly according to FIG. 39 at time t6, i.e. when the last nuclear magnetic resonance signal of the read-out phase B1 has been read out. Zero-axis crossings of the phase thus arise again, with a nuclear magnetic resonance signal (not shown for clarity) occurring at each zero-crossing. As many nuclear magnetic resonance signals as in the first read-out phase B1 can also be acquired in the second read-out phase B2. The nuclear magnetic resonance signals are also phase-coded during the read-out phase B2.

More than the two read-out phases B illustrated in the exemplary embodiment of FIGS. 38 through 39 can follow one excitation phase A as a result of the multiple reversal of the read-out gradient GR.

Signals arising during the read-out phase were only schematically shown in the figures. For an experimentally produced plot, FIG. 7 shows an example of the actual signal course. The evaluated signals are thereby referenced 1 through 8; the signals derived from the FID signals of the radio frequency pulses RF2 through RF4 are referenced F1 through F4 and are not evaluated in the illustrated exemplary embodiment, even though this would be fundamentally possible. It can be seen that the individual signals have an irregular amplitude distribution. Without further measures, this would lead to artifacts in the image reconstruction. In fact, a scaling on the basis of different attenuations or amplifications is therefore required in the signal processing in order to achieve a uniform amplitude distribution.

Figure 43:
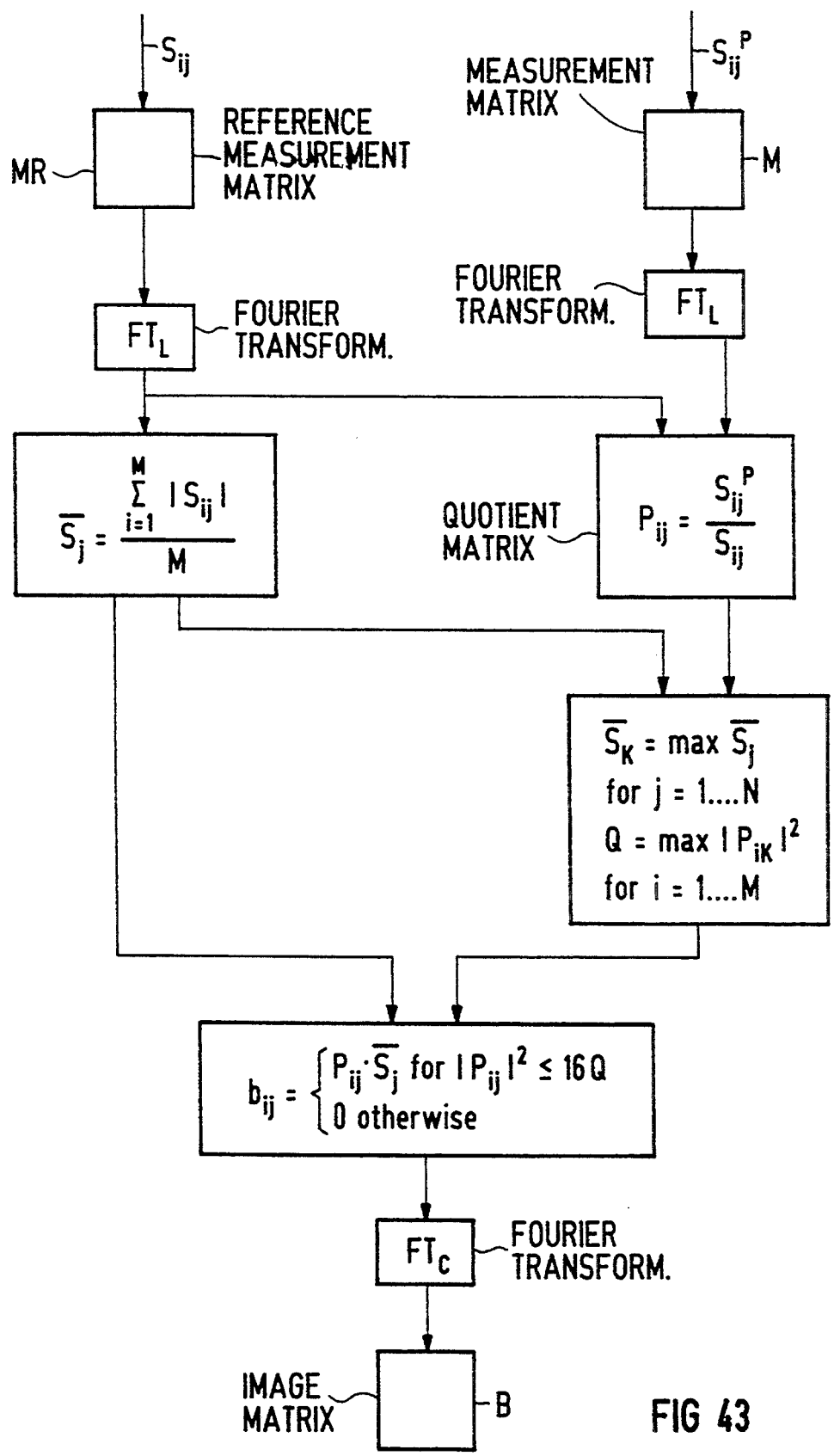
FIG. 43 is a flowchart showing the steps in accordance with the inventive method for scaling the signal amplitudes.

One can first implement a reference measurement without a phase-coding gradient in order to acquire the amplitude distribution. Each of the previously presented pulse sequences is suitable for this purpose, with the phase-coding gradient GP omitted. The reference signals acquired in this way can be entered into a reference matrix. This procedure is schematically illustrated in a flowchart of FIG. 43. The non-phase-coded nuclear magnetic resonance signals are thereby referenced $S_{ij}$; the corresponding phase-coded nuclear magnetic resonance signals are referenced $S_{ij}^P$. The row number is thereby indicated by i the column number is indicated by j. The signals $S_{ij}$ are entered into a measurement matrix MR (used as a reference matrix) the signals $S_{ij}^P$ are entered in a measurement matrix M. Both matrices are Fourier-transformed in the row direction (corresponding to the direction of the read-out gradient), this being referenced $FT_L$ in FIG. 3. A quantity $P_{ij}$ containing the phase information of the measured signals $S_{ij}$ is formed pixel-by-pixel by forming the quotient each of the phase-coded signals $S_{ij}^P$ and the corresponding non-phase-coded signals $S_{ij}$ (thereby forming a quotient matrix). Further, an averaging over all rows i is implemented in the measurement matrix M that has been Fourier-transformed in the row direction, so that, given a measurement matrix having M rows and N columns, N signals $\overline{S}_j$, with $$\overline{S}_j = \sum_{i=1}^{m} |S_{ij}|/M,$$

are obtained. These signals correspond to an average over all projections. An auxiliary quantity Q is also formed in the following way.

First, the largest average of the signal $\overline{S}_j$ is sought, the column number thereof being referenced k, i.e., $$\overline{S}_k = \max \overline{S}_j \text{ for } j=1 \ldots N.$$

The auxiliary value Q is calculated for this row k in the following way:

$$Q = \max |P_{ik}|^2 \text{ for } i=1 \ldots M.$$

Values $b_{ij}$ are then calculated pixel-by-pixel in a further matrix with the quantities found in this way, being calculated according to the following strategy:

$$b_{ij} = P_{ij} \cdot \overline{S}_j \text{ for } |P_{ij}|^2 < 16Q$$

$b_{ij} = 0$ when the above condition is not satisfied.

An amplitude limitation is implemented with this condition, thereby preventing, for example, that division $S_{ij}^P/S_{ij}$ outside of the subject, for example due to noises, leads to arbitrary values with no diagnostic utility.

The exact condition for the elimination of meaningless values, of course, can also be differently constituted, however, the aforementioned condition for amplitude limitation has proven effective.

A Fourier transformation $FT_c$ in the column direction is now implemented in the matrix with the quantities $b_{ij}$ so that the image matrix B is ultimately obtained on the basis of which an image of the examined subject can be constructed.

The signals $S_{ij}$ for producing the reference matrix MR can, for example, be acquired in a complete excitation read-out cycle, but this results in a corresponding lengthening of the measuring time. It is also possible, however, to employ the signals S acquired during the excitation phase A, as shown, for example, in FIG. 18, for producing the reference matrix MR, whereby all phase coding for these signals is merely omitted.

Upon observation of the amplitude spectrum of the nuclear magnetic resonance signals S, one can find that, first, certain symmetries are present and, second, that different signals always have the same amplitude or the amplitudes have a fixed relationship to one another. When one exploits this fact, a complete data set need not be produced for the reference matrix MR since, for example, signals that are not measured can be synthesized on the basis of the aforementioned information. Considerable measuring time for the acquisition of the reference signals can thus be saved.

Further, it is also possible to permanently set the amplitude scaling for the pulse sequence on the basis of a single reference measurement.

It should be noted that the illustrated exemplary embodiments represent only individual possibilities of a multitude of pulse sequences for the realization of the invention. For example, a combination of the illustrated pulse sequences is possible. Thus, for example, the phase-coding gradient can remain activated everywhere, as in FIG. 27, instead of being realized in the form of individual pulses. Further, the signals S in all exemplary embodiments can also be realized by inversion of the read-out gradient according to FIG. 20. The slice selection can also relate to all radio frequency pulses, as in FIG. 21.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance imaging apparatus for obtaining an image of an examination subject, comprising the steps of:
   (a) exposing an examination subject to a sequence of RF excitation pulses having pauses therebetween during an excitation phase, said RF excitation pulses exciting nuclear spins in said examination subject and thereby causing nuclear magnetic resonance signals, having phase and amplitude, to arise in said examination subject;
   (b) exposing said examination subject to a first gradient in a first direction at least in said pauses, said first gradient having different areas between successive RF pulses;
   (c) re-phasing all of said nuclear magnetic resonance signals
   (d) reading out said nuclear magnet resonance signals during a read-out phase by exposing said examination subject to a read-out gradient having at least one component in said first direction; and
   (e) analyzing the read out nuclear magnetic resonance signals according to amplitude and phase and constructing an image of said examination subject therefrom.

2. A method as claimed in claim 1 wherein step (c) is further defined by first exposing said examination subject to 180° RF pulse following said sequence of RF excitation pulses.

3. A method as claimed in claim 1 wherein step (d) is further defined by reading out said nuclear magnetic resonance signals during a read-out phase by exposing said examination subject to a read-out gradient having at least one component in a direction opposite to said first direction for re-phasing said nuclear magnetic resonance signals following said sequence of RF excitation pulses.

4. A method as claimed in claim 1 wherein step (a) is further defined by distributing said gradient areas between successive RF excitation pulses so that said nuclear magnetic resonance signals used for generating an image of said examination subject are not superimposed in said read-out phase.

5. A method as claimed in claim 4 wherein the step of distributing said gradient areas is further defined by distributing said gradient areas by increasing said gradient areas by a factor of 3 from excitation pulse to excitation pulse, sorted according to size.

6. A method as claimed in claim 1 wherein step (a) is further defined by generating RF excitation pulses in said sequence of RF excitation pulses having flip angles having a sum during said excitation phase significantly greater than 180°.

7. A method as claimed in claim 1 wherein step (a) is further defined by generating a first RF excitation pulse in said sequence of RF excitation pulses having a flip angle of 90°, and generating subsequent RF excitation pulses in said sequence of RF excitation pulses having respective flip angles between 60° and 90°.

8. A method as claimed in claim 1 comprising the additional step of exposing said examination subject to a phase-coding gradient in a direction perpendicular to said first direction during step (d).

9. A method as claimed in claim 8 wherein the step of exposing said examination subject to a phase-coding gradient is further defined by exposing said examination subject to a phase-coding gradient activated only between the arising nuclear magnetic resonance signals.

10. A method as claimed in claim 8 wherein the step of subjecting said examination subject to a phase-coding gradient is further defined by continuing exposure of said examination subject to said phase-coding gradient during said read-out phase.

11. A method as claimed in claim 1 comprising the additional step of exposing said examination subject to a phase-coding gradient disposed perpendicularly to said first direction during said excitation phase.

12. A method as claimed in claim 1 comprising the additional step of additionally reading out said nuclear magnetic resonance signals during said excitation phase and employing the nuclear magnetic resonance signals read out during said excitation phase for constructing said image in step (d) in addition to the nuclear magnetic resonance signals read out during said read-out phase.

13. A method as claimed in claim 1 wherein step (c) is further defined by first exposing said examination subject to a 180° RF pulse simultaneously with exposing said examination subject to a second gradient in a direction perpendicular to said first gradient, and thereby inverting only the nuclear spins in a selected slice of said examination subject.

14. A method as claimed in claim 13 comprising the additional step of exposing said examination subject to a phase-coding gradient, and wherein the step of exposing said examination subject to a 180° RF pulse is further defined by exposing said examination subject to a 180° RF pulse while simultaneously exposing said examination subject to a second gradient disposed perpendicular to said first gradient and to said phase-coding gradient, and thereby inverting only the nuclear spins in a selected slice of said examination subject.

15. A method as claimed in claim 1 wherein step (a) is further defined by exposing said examination subject to a sequence of slice-selective RF excitation pulses during said excitation phase.

16. A method as claimed in claim 1 wherein step (b) is further defined by exposing said examination subject to a first gradient in said pauses, said first gradient having gradient areas which geometrically increase between successive RF excitation pulses after a second RF excitation pulse in said sequence of RF excitation pulses.

17. A method as claimed in claim 1 wherein said read out nuclear magnetic resonance signals have an amplitude distribution in k-space, and wherein each RF excitation pulse has a flip angle associated therewith, and comprising the additional step of optimizing said amplitude distribution of said nuclear magnetic resonance signals in the k-space during said read-out phase by selection of the flip angles of said RF excitation pulses.

18. A method as claimed in claim 1 wherein said nuclear magnetic resonance signals have an amplitude distribution in the k-space, and comprising the additional step of optimizing said amplitude distribution of said nuclear magnetic resonance signals in the k-space by controlling phase coding of said nuclear magnetic resonance signals.

19. A method as claimed in claim 18 wherein the step of optimizing said amplitude distribution of said nuclear magnetic resonance signals in the k-space by controlling phase coding is further defined by the steps of:
  exposing said examination subject to a first phase-coding gradient in a direction perpendicular to said first direction;
  exposing said examination subject to a second phase-coding gradient in a direction perpendicular to said first phase-coding gradient and to said read-out gradient, said second phase-coding gradient assuming n different values in n successive excitation and read-out phases; and
  wherein step (e) is further defined by constructing an image of said examination subject having a three-dimensional topical resolution.

20. A method as claimed in claim 18 wherein the step of optimizing said amplitude distribution of said nuclear magnetic resonance signals in the k-space by controlling phase coding is further defined by the steps of:
  exposing said examination subject to a first phase-coding gradient in a direction perpendicular to said first direction;
  exposing said examination subject to a second phase-coding gradient in a direction perpendicular to said first phase-coding gradient and to said read-out gradient;
  switching said second phase-coding gradient with n different values in a single excitation and read-out phase and thereby coding said nuclear magnetic resonance signals in the direction of said second phase-coding gradient; and
  wherein step (e) is further defined by constructing an image of said examination subject having a three-dimensional topical resolution.

21. A method as claimed in claim 1 wherein said nuclear magnetic resonance signals have an amplitude distribution in k-space, and comprising the additional step of optimizing said amplitude distribution of said nuclear magnetic resonance signals in k-space by differently scaling the amplitudes of said nuclear magnetic resonance signals.

22. A method as claimed in claim 21 comprising the additional steps of:

acquiring two sets of read-out nuclear magnetic resonance signals with one set being phase coded and the other set being non-phase coded; and wherein the step of scaling said nuclear magnetic resonance signals is further defined by employing said non-phase coded set of nuclear magnetic resonance signals as a reference for scaling said amplitudes of said phase-coded nuclear magnetic resonance signals.

23. A method as claimed in claim 22 wherein the step of obtaining two sets of nuclear magnetic resonance signals is further defined by obtaining a set of phase-coded nuclear magnetic resonance signals during a first excitation and read-out phase and obtaining a non-phase coded set of nuclear magnetic resonance signals during a second, separate excitation and read-out phase.

24. A method as claimed in claim 22 wherein the step of acquiring two sets of nuclear magnetic resonance signals is further defined by obtaining a set of non-phase coded nuclear magnetic resonance signals during said excitation phase.

25. A method as claimed in claim 22 wherein said nuclear magnetic resonance signals exhibit amplitude symmetries and wherein the step of acquiring two sets of nuclear magnetic resonance signals is further defined by acquiring a set of non-phase coded nuclear magnetic resonance signals consisting only of a plurality of non-phase coded nuclear magnetic resonance signals as is needed for generating said amplitude distribution employing said amplitude symmetries.

26. A method as claimed in claim 22 wherein said phase-coded set of nuclear magnetic resonance signals is phase coded in a phase-coding direction, and comprising the additional steps of:

entering said phase-coded set of nuclear magnetic resonance signals in a raw data matrix;

entering said non-phase coded set of nuclear magnetic resonance signals into a reference matrix, each nuclear magnetic resonance signal in said raw data matrix having a corresponding nuclear magnetic resonance signal in said reference matrix;

undertaking a Fourier transformation in the read-out direction of said raw data matrix to obtain a Fourier transformed raw data matrix;

undertaking a Fourier transformation of said reference matrix in the read-out direction to obtain a Fourier transformed reference matrix;

dividing each signal in said Fourier transformed raw data matrix by the corresponding signal in the Fourier transformed reference matrix thereby forming a quotient matrix; and forming an image matrix for constructing said image of said examination subject by Fourier transforming said quotient matrix in the phase-coding direction.

27. A method as claimed in claim 22 comprising the additional steps of: exposing said examination subject to at least one 180° RF pulse-before step (c) for causing at least one further inversion of said nuclear spins; and undertaking a further read out of said nuclear magnetic resonance signals during a further read-out phase after each 180° RF pulse under a further read-out gradient having at least one component in said first direction.

28. A method as claimed in claim 27 comprising the additional step of exposing said examination subject to a phase-coding gradient having an operational sign which changes from read-out phase to further read-out phase.

29. A method as claimed in claim 1 comprising the additional steps of:

inverting said read-out gradient at least once during step (c); and reading out said nuclear magnetic resonance signals in at least one further read-out phase under said inverted read-out gradient.

30. A method as claimed in claim 29 comprising the additional step of:

exposing said examination subject to a phase-coding gradient during said read-out phase and each further read-out phase.

* * * * *